(12) United States Patent
Huang et al.

(10) Patent No.: US 8,304,906 B2
(45) Date of Patent: Nov. 6, 2012

(54) PARTIAL AIR GAP FORMATION FOR PROVIDING INTERCONNECT ISOLATION IN INTEGRATED CIRCUITS

(75) Inventors: Cheng-Lin Huang, Hsinchu (TW);
Jiing-Feng Yang, Zhubei (TW);
Chii-Ping Chen, Taichung (TW);
Dian-Hau Chen, Hsinchu (TW);
Yuh-Jier Mii, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 132 days.

(21) Appl. No.: 12/789,634

(22) Filed: May 28, 2010

(65) Prior Publication Data

US 2011/0291281 A1    Dec. 1, 2011

(51) Int. Cl.
*H01L 23/532* (2006.01)

(52) U.S. Cl. .................. 257/750; 257/762; 257/E23.161

(58) Field of Classification Search .................. 257/750, 257/762, E23.161
See application file for complete search history.

(56) References Cited

U.S. PATENT DOCUMENTS

| 2008/0185722 A1* | 8/2008 | Liu et al. | 257/751 |
| 2008/0254600 A1* | 10/2008 | Liu et al. | 438/494 |
| 2011/0272812 A1* | 11/2011 | Horak et al. | 257/758 |

\* cited by examiner

*Primary Examiner* — Cuong Q Nguyen
*Assistant Examiner* — Tran Tran
(74) *Attorney, Agent, or Firm* — Haynes and Boone, LLP

(57) ABSTRACT

Partial air gap formation for providing interconnect isolation in integrated circuits is described. One embodiment is an integrated circuit ("IC") structure includes a substrate having two adjacent interconnect features formed thereon; caps formed over and aligned with each of the interconnect features; sidewalls formed on opposing sides of each of the interconnect features and a gap formed between the interconnect features; and a dielectric material layer disposed over the substrate to cover the caps and the gap.

20 Claims, 5 Drawing Sheets

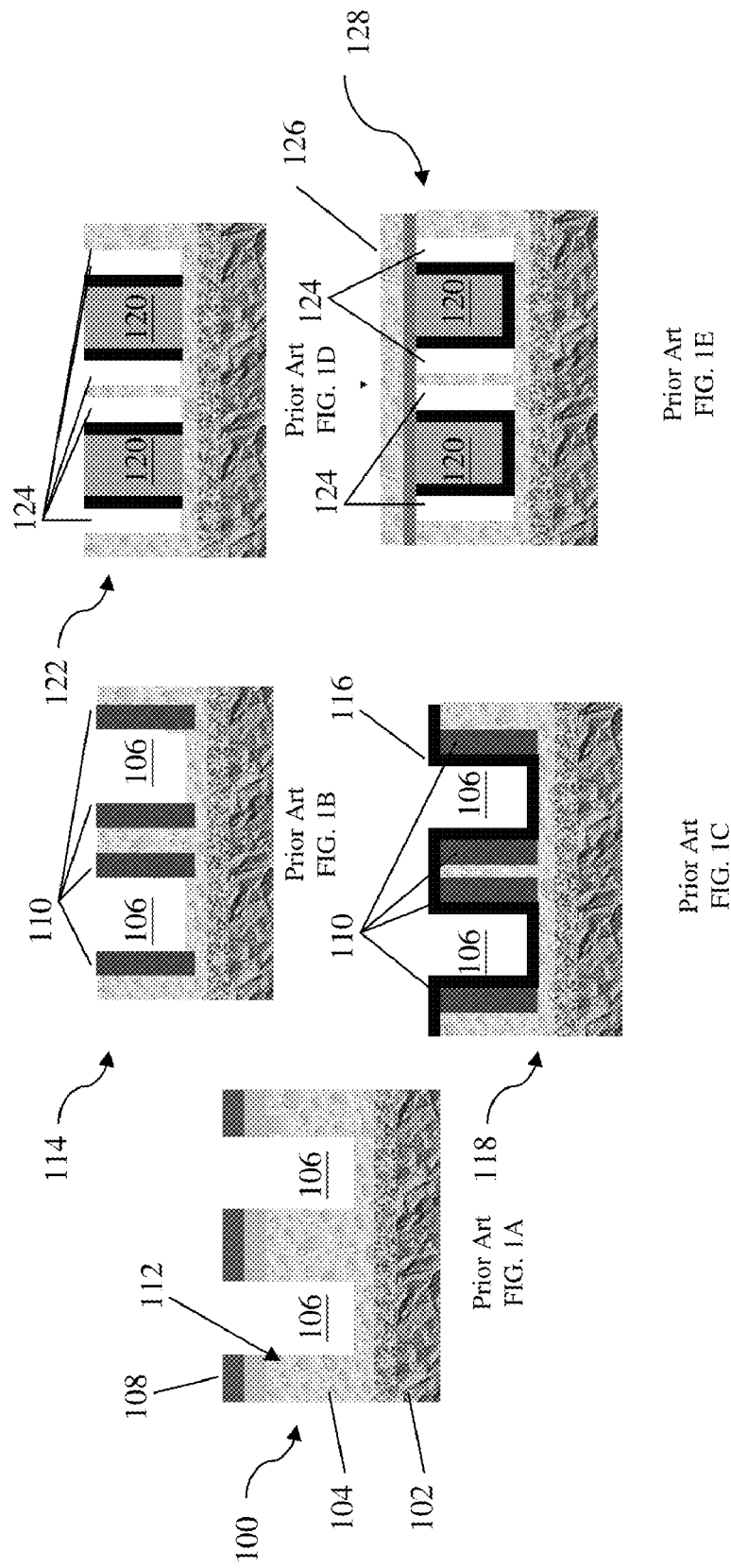

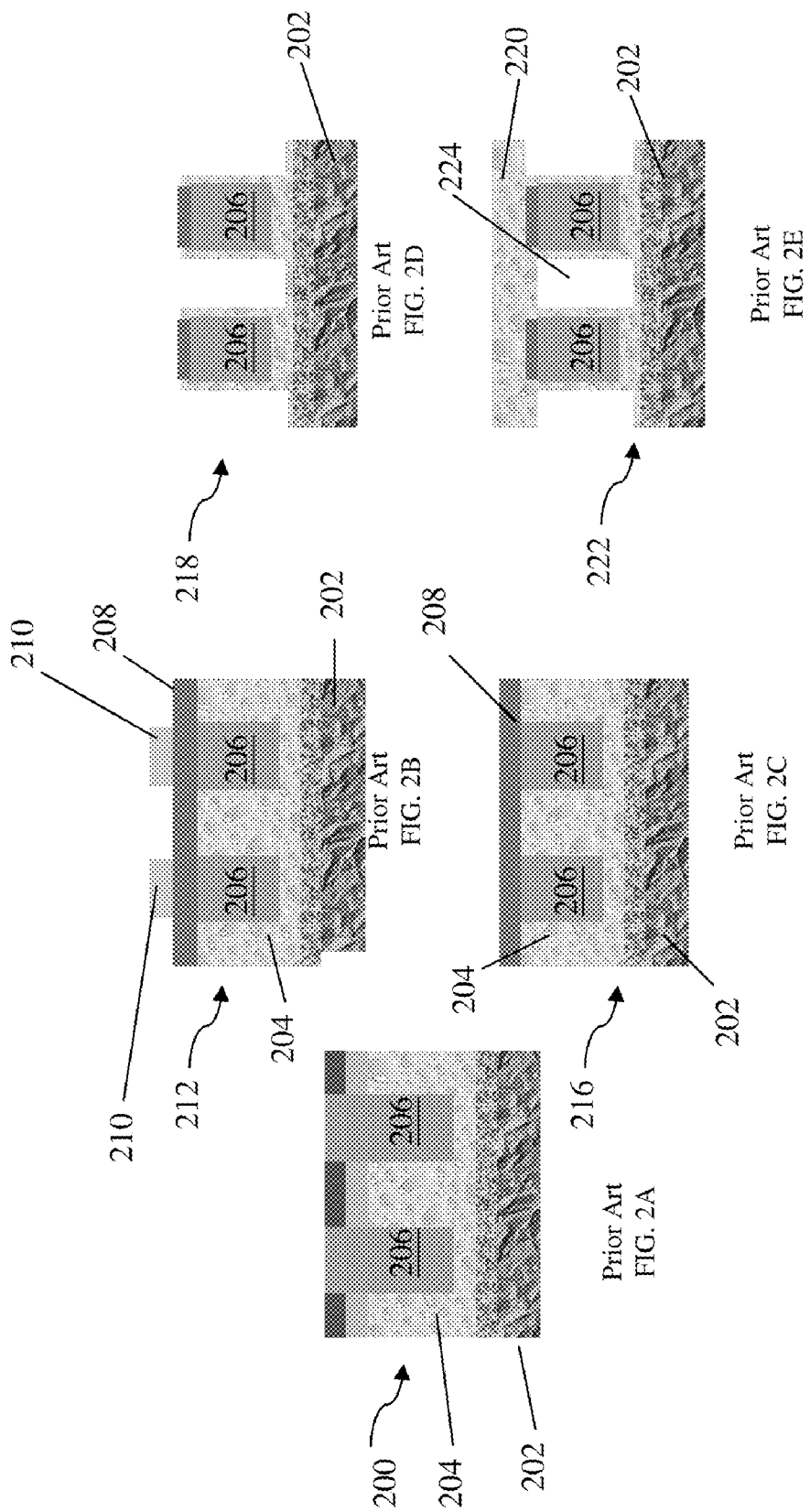

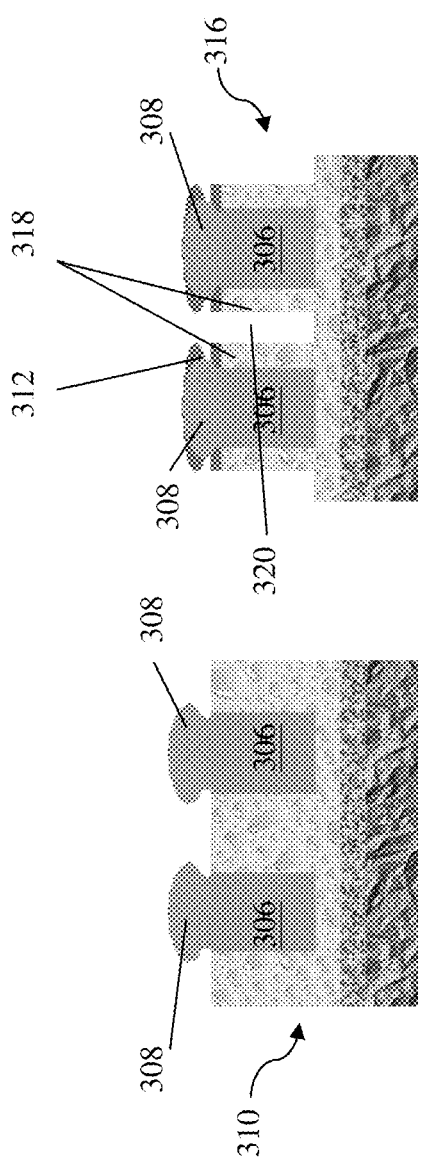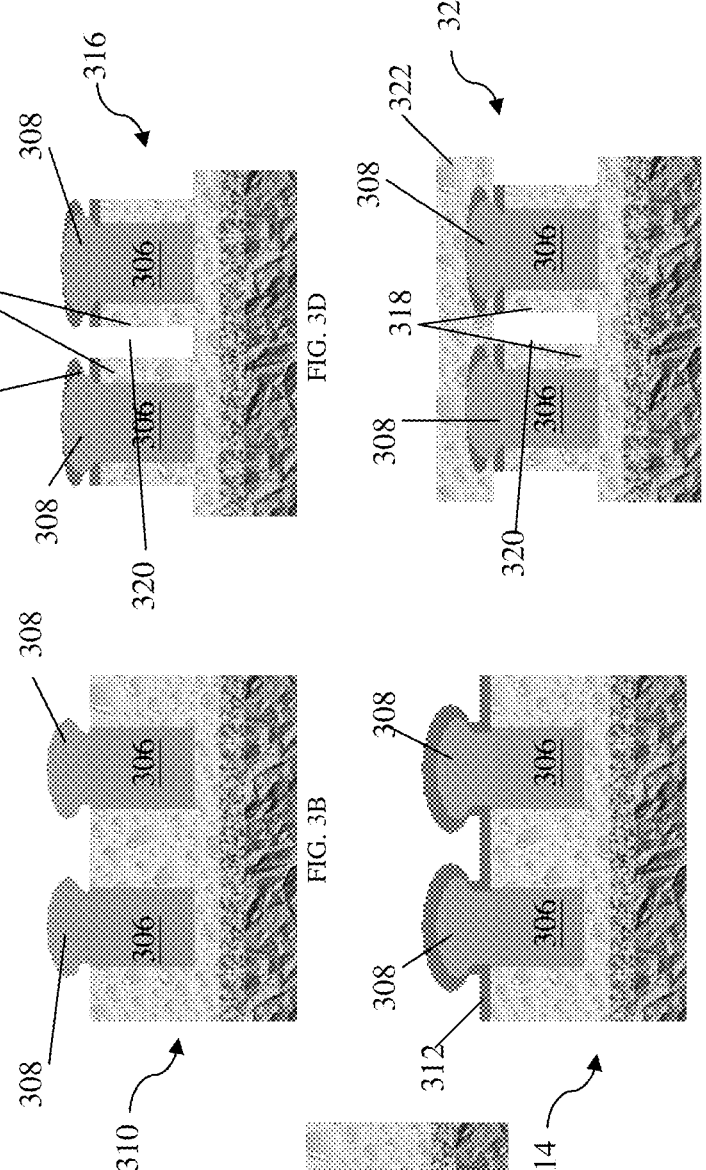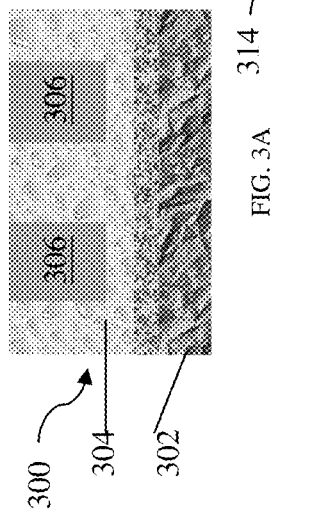

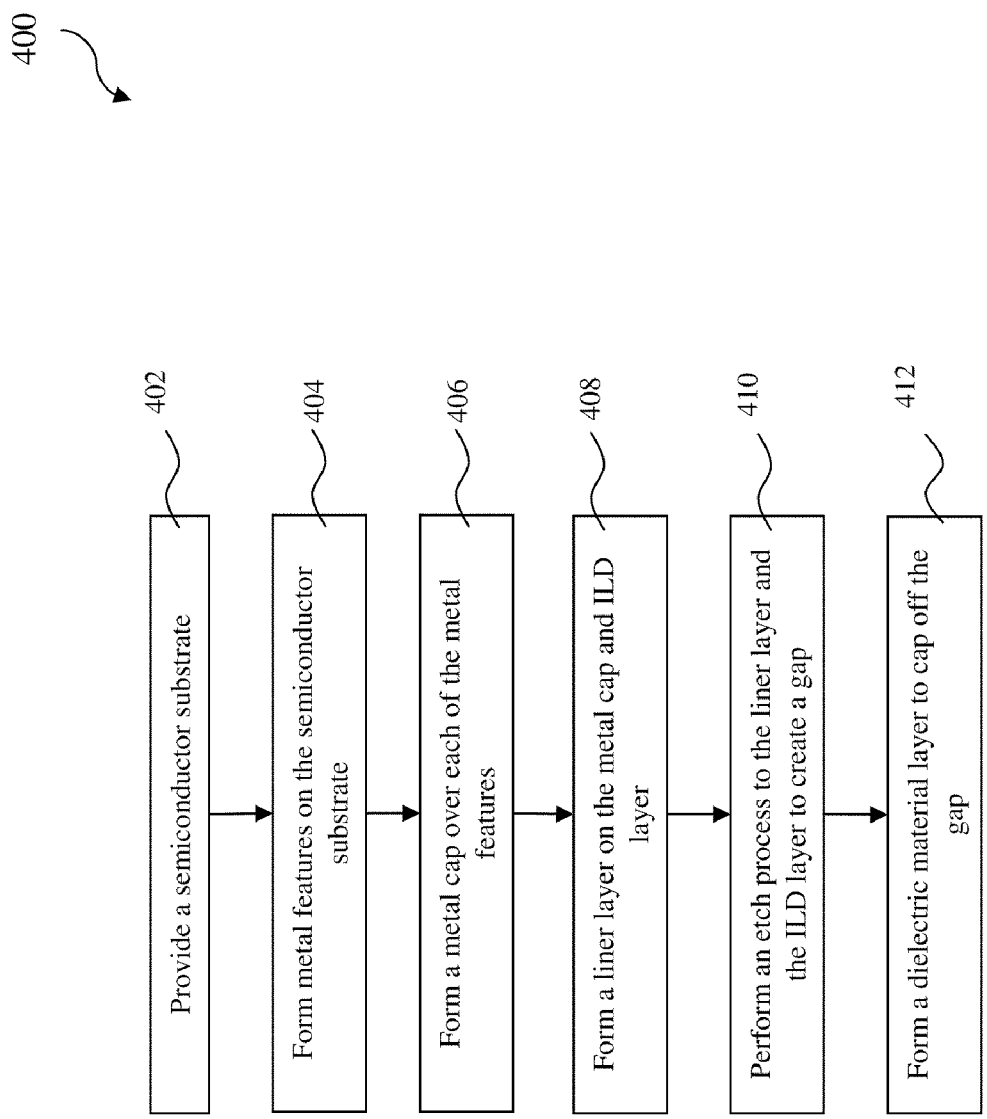

PARTIAL AIR GAP FORMATION FOR PROVIDING INTERCONNECT ISOLATION IN INTEGRATED CIRCUITS

BACKGROUND

The present disclosure relates generally to manufacture of integrated circuits ("ICs") and, more particularly, to a system and method for partial air gap formation for providing interconnect isolation in such ICs.

As IC transistor densities increase, capacitive coupling between adjacent elements also increases. This increase in capacitive coupling further results in increased parasitic capacitance, which negatively impacts the speed and overall performance of the IC device.

Decreased resistance×capacitance ("R×C") propagation delay is demanded in back-end-of-line ("BEOL") interconnects due to resulting improvement in device performance. Introducing an air gap between interconnects is one manner by which the effective dielectric constant ("$k_{eff}$") can be effectively reduced in such situations. Currently, there are several means by which an air gap may be introduced; however, each are costly and difficult to scale. In particular, they each require an additional sub-lithographic patterning step, an additional co-polymer patterning step, and/or non-conformal inter-metal layer deposition.

SUMMARY

One embodiment is an integrated circuit ("IC") structure including a substrate having two adjacent interconnect features formed thereon; caps formed over and aligned with each of the interconnect features; sidewalls formed on opposing sides of each of the interconnect features and a gap formed between the interconnect features; and a dielectric material layer disposed over the substrate to cover the caps and the gap.

Another embodiment is an integrated circuit ("IC") structure comprising two metal features formed on a semiconductor substrate; caps formed on and directly overlying each of the interconnects; a liner disposed on each of the caps; sidewalls formed on opposing sides of each of the interconnects and a gap disposed between the interconnects; and a dielectric layer disposed over the semiconductor substrate to cover the cap and the gap.

Yet another embodiment is a method comprising performing a selective growth to form caps over each of two adjacent metal features formed in a dielectric layer of a substrate; depositing a liner over the substrate and the caps; dry etching the substrate to remove all but a portion of the dielectric layer to create sidewalls on each of the interconnects and a gap between the interconnects; and depositing a low-k dielectric material layer over the substrate to cover the caps and the gap.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A-1E and 2A-2E illustrate prior art methods of introducing an air gap for providing interconnect isolation in an IC.

FIGS. 3A-3E illustrate sectional views of an integrated circuit (IC) structure having an air gap for providing interconnect isolation in accordance with one embodiment.

FIG. 4 is a flowchart of a method of introducing an air gap for providing interconnect isolation in an IC in accordance with one embodiment.

DETAILED DESCRIPTION

Figure 5B:
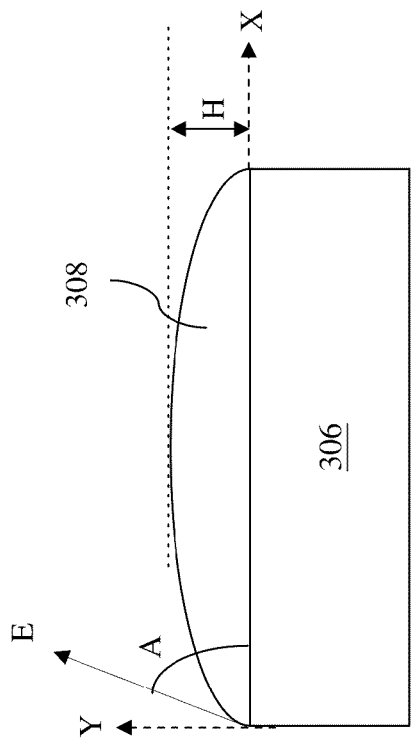
FIGS. 5A-5B illustrate sectional views of portions of the IC structure.

The present disclosure relates generally to manufacture of ICs and, more particularly, to system and method for partial air gap formation for providing interconnect isolation in such ICs. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

FIGS. 1A-1E collectively illustrate a prior art method of introducing an air gap for providing interconnect isolation in an IC. The process begins in FIG. 1A with a structure 100 comprising a substrate 102 having a dielectric layer 104 in which trenches 106 have been created using a dual-damascene or other process. A photoresist strip is performed to strip a photoresist layer 108 and damage layer 110 is formed on the sidewalls 112 of the trenches 106 by plasma treatment, resulting in a structure 114, as shown in FIG. 1B. It will be recognized that plasma damage to the sidewall layers 110 may result from this step. Next, as shown in FIG. 1C, a protective layer 116 is deposited on the structure 114, resulting in a structure 118. At this point, electroplating ("ECP") is performed to deposit Cu 120 in the trenches 106, after which chemical mechanical planarization ("CMP") and wet etching are performed to remove the sidewall damage layers 110, resulting in a structure 122 comprising air gaps 124 where the sidewall damage layers 110 previously existed, as shown in FIG. 1D. Finally, a capping layer 126 is deposited for formation of the next dual damascene process, resulting in a structure 128, as shown in FIG. 1E. The foregoing embodiment suffers several deficiencies, including Cu damage resulting from wet etching, limited improvement in capacitance, and non-uniform sidewall protection deposition.

FIGS. 2A-2E collectively illustrate two other prior art methods of introducing an air gap for providing interconnect isolation in an IC. Both processes begin with a structure 200, as shown in 2A, comprising a substrate 202 having a layer 204 in which trenches have been created and filled with Cu, thereby to create interconnects 206. In one of the methods, as shown in FIG. 2B, the next step is to perform CMP, followed by deposition of a protective layer 208 over the layer 204, which comprises a dielectric material, and then coating and patterning of a photoresist layer 210, resulting in a structure 212. Next, the structure 212 is dry or wet etched, resulting in a structure 218, as shown in FIG. 2D.

Alternatively, as shown in FIG. 2C, the layer 204 comprises a block copolymer in which trenches have been created and filled with Cu, thereby to create interconnects 206. CMP is then performed, followed by deposition of the protective layer 208, resulting in a structure 216. Next, the block copolymer comprising the layer 204 is thermal decomposed, after which a non-conformal deposition of an ELK dielectric layer 220 is performed, resulting in a structure 222 having air gaps 224 between the interconnects 206, as shown in FIG. 2E.

The embodiments illustrated in FIGS. 2A-2E suffer several deficiencies, including the fact that they require the performance of an extra photo-patterning step. Moreover, the second method requires the use of a relatively new and untested porous material (i.e., the block copolymer 214) and both require control of non-conformal deposition of ELK 220.

FIGS. 3A-3E illustrate sectional views of an integrated circuit (IC) structure with an air gap for providing interconnect isolation in an IC in accordance with one embodiment. FIG. 4 provides a flowchart of a method 400 for making the IC structure and introducing an air gap for providing interconnect isolation. Referring now to FIGS. 3A-3E and 4, the integrated circuit structure having an air gap and a process of making the same are collectively described.

The process begins at step 402 with an integrated circuit (IC) structure 300 after post CMP-inspection structure. The integrated circuit structure 300 includes a semiconductor substrate 302. The semiconductor substrate 302 may comprise silicon. Alternatively, the semiconductor substrate 302 includes germanium, silicon germanium or other proper semiconductor materials. The semiconductor substrate 302 also includes various isolation features such as shallow trench isolation (STI) formed in the substrate to separate various devices. Although not shown, various STI features may be formed in the substrate 302, defining various active regions. The formation of the STI features includes etching a trench in a substrate and filling the trench by one or more insulator materials such as silicon oxide, silicon nitride, or silicon oxynitride. In one embodiment, the STI feature is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The semiconductor substrate 302 also includes various doped features, such as n-wells, p-wells, light doped drain (LDD) features, heavily doped source/drain (S/D) features configured to form various IC devices, such as field-effect transistors (FETs). The semiconductor substrate 302 may alternatively or additionally include a subset of other IC active devices and passive devices including imaging sensors, memory devices, light emitting diodes, capacitors, and resistors. In one example, the FETs include metal-oxide-semiconductor transistors. In furtherance of the example, the FETs include fin-like field-effect transistors (Fin-FETs).

The IC structure 300 further includes a gate stack (not shown) formed on the semiconductor substrate 302 and configured as a component of a FET. In one embodiment, the FET utilizes a high k dielectric material and metal in the gate stack. In one embodiment, the high k dielectric material includes HfO2. Alternatively, the high k dielectric material layer includes metal nitrides, metal silicates or other metal oxides. In another embodiment, the high k dielectric material layer can be formed by other suitable process such as metal organic chemical vapor deposition (MOCVD), or molecular beam epitaxy (MBE). The metal in the gate stacks include aluminum, tungsten, other suitable metal or metal alloy.

The gate stacks may further include an additional metal or other conductive material layer with a proper work function. In one embodiment, a gate electrode for a nFET includes a metal-based conductive material (n-metal) having a work function compatible to the nFET. For one example, the n-metal has a work function of about or less than about 4.2 eV. In one embodiment, the n-metal includes tantalum (Ta), titanium aluminum (TiAl), titanium aluminum nitride (TiAlN), or a combination thereof. In another embodiment, a gate stack for a pFET includes a metal-based conductive material (p-metal) having a work function compatible to the pFET. For one example, the p-metal has a work function of about or greater than about 5.2 eV. In one embodiment, the p-metal includes titanium nitride (TiN) or tantalum nitride (TaN). The n-metal and p-metal layer can be formed by a suitable process, such as physical vapor deposition (PVD), CVD, ALD, PECVD, PEALD or spin-on metal.

The IC structure 300 may further include interconnect features for electrical routing to form a functional integrated circuit. The interconnect usually includes multiple metal layers, such as metal one, metal two, and etc. The interconnect includes metal lines for horizontal routing and other features (such as contacts and vias) for vertical routing. One or more dielectric materials are disposed between various metal features to provide electrical isolation. FIG. 3A illustrates two exemplary metal features for simplicity. The IC structure 300 includes an a dielectric layer 304, such as an interlayer dielectric (ILD) layer, formed on the semiconductor substrate 302.

The ILD layer 304 includes silicon oxide, low k dielectric material, other suitable dielectric materials, or combinations thereof. The ILD layer 304 is formed by a suitable technique, such as CVD. For example, a high density plasma CVD may be implemented to form the ILD layer 304. In one embodiment, the ILD layer 304 deposits on the substrate 302 and on the gate stacks. In one embodiment, a chemical mechanical polishing (CMP) process may be applied to the ILD layer 304 to reduce the thickness of the ILD layer 304 and to planarize the ILD layer 304.

Still referring to FIGS. 3A and 4, the method 400 proceeds to step 404 to form metal features (interconnects) 306. In one embodiment, the IC structure 300 includes two adjacent metal features 306 disposed in the ILD layer 304. In furtherance of the embodiment, the metal features 306 include copper formed by a damascene process. Particularly, the metal features 306 may have a multi-layer structure and includes copper, copper alloy, metal silicide, or combinations. In one example, the damascene process to form the metal features 306 includes patterning the ILD layer 304 using a lithography process and an etch process to form trenches in the ILD layer 304; filling the conductive material layers in the trenches; and then applying a polishing process, such as CMP, to remove the excessive conductive material and planarize the surface of the ILD layer 304. The filling the trenches includes forming a liner layer, such as a titanium nitride; forming copper seed layer by sputtering; and then forming bulk copper on the copper seed layer by a plating technique.

Referring to FIGS. 3B and 4, the method 400 proceeds to step 406 by forming a metal cap 308 over each of interconnects 306. In one embodiment, the metal cap 308 is formed by selective growth via an electro-less plating process, resulting in a structure 310. Since the metal cap is selectively grown on the metal features 306, the metal cap 308 is formed only on each of the metal features 306 but not on the ILD layer 304, the metal features 306 are substantially aligned with the metal features. In another embodiment, the metal caps 308 are formed from cobalt tungsten phosphide (CoWP). Alternatively, the metal caps 308 may be formed tantalum (Ta), tantalum nitride (TaN), or ruthenium (Ru), for example. In another embodiment, the metal caps 308 includes a thickness ranging between about 3 nm and about 20 nm.

Referring to FIGS. 3C and 4, the method 400 proceeds to step 408 by forming a liner 312 over the substrate 310. Particularly, the liner 312 is deposited over the metal features 308 and the dielectric layer 304 by any one of a number of known methods, resulting in a structure 314. In one embodiment, the liner 312 includes SiOC. The liner 312 may alternatively include SiN or SiON. In one embodiment the thickness of the liner is about 10 nm-55 nm.

Figure 5A:
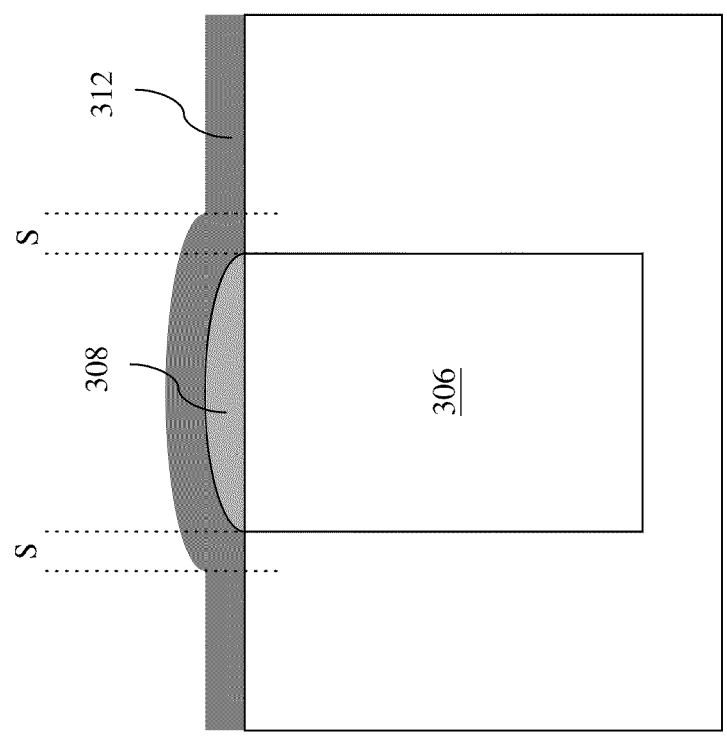

In a similar embodiment, the metal caps 308 and the liner 312 are further described in details with reference to FIGS. 5A and 5B as sectional views of portions of the IC structure 314. The metal cap 308 includes a shape illustrated in FIG. 5B. The edge of the metal cap 308 has a angle with the substrate surface (the horizontal direction "X") as "A". Specifically, the tangent line of the metal cap 308 at its edge is in a direction "E". The angle between the direction "E" and the horizontal direction "X" is referred to "A". In one embodiment, the angle "A" ranges between about 45° and about 90°. The metal cap 308 further includes a height "H" defined in its central portion and illustrated in FIG. 5B. In one embodiment, the height "H" of the metal cap 308 ranges between about 3 nm and about 20 nm.

The liner layer 312 includes a portion referred as spacer, which has a width labeled as "S" in FIG. 5A. In one embodiment, the spacer has a width "S" of about 15 nm. After an etch process implemented at next step, the spacer and another portion of the liner layer 312 on the metal cap remains. The further function of the spacer will be described below.

Referring to FIGS. 3D and 4, the method 400 proceeds to step 410 by performing an etch process to the liner layer 312 and the ILD layer 304, creating a structure 316, as shown in FIG. 3D. The etch process is first applied to the liner layer 312 to substantially remove the portion on the ILD layer 304 but the spacer and the portion of the liner layer 312 on the metal cap remain as noted above. Second, the etch process proceeds to etch the ILD layer 304, forming dielectric sidewalls 318 disposed on the sides of the metal features (interconnects) 306 and a gap 320 between the interconnects 306. In alternative embodiment, the etch process includes two sub-steps including a first etch step designed to etch the liner layer 312, and a second etch step designed to etch the ILD layer 304. In another embodiment, the etch process utilizes an anisotropic etch technique, such as a dry etch performed using plasma etching. Alternatively, the etch process may includes a wet etch performed using HF acid.

In accordance with one embodiment, the thickness of each the sidewalls 318 is substantially equal to that of the other sidewalls and is controlled by the spacer of the liner layer 312. The spacers cover the portion of the ILD layer 304 between the adjacent metal features 306 during the etch process, creating the gap spaced away from the metal features by the sidewalls 318. The sidewalls 318 are substantially self-aligned with the spacer. Furthermore, the thickness of each the sidewalls 318 is controlled by the three steps including the selective growth of the metal cap 308, the deposition of the liner layer 312, and the etching process. More particularly, the thickness of each of the sidewalls 318 is determined by the shape and thickness of the metal cap 308, the thickness and conformity of the liner, and the duration of the etch process.

Finally, with reference to FIGS. 3E and 4, the method 400 proceeds to step 412 by forming a dielectric material layer 322 over the structure 316 to cap off the air gap 320, resulting in a structure 324. In one embodiment, the dielectric material layer 322 includes low k dielectric material. The dielectric material layer 322 may be formed by CVD, spin coating and other suitable technique. In another embodiment, an etch stop layer ("ESL") may also be deposited over the structure 316 in the same manner as the dielectric material layer 322.

In one embodiment, if the air gap 320 is small, for example, less than 6 nm, the liner 312 may cover the air gap. In contrast, if the air gap 320 is large, for example, greater than 6 nm, the dielectric material may fill in the air gap, thereby destroying it. In this situation, a thermal decomposable polymer ("TDP") may be used to form the air gap. In particular, after the etching, TDP is used to fill the air gap 320. After deposition of ESL, the structure is annealed to decompose the TDP, thus forming the air gap.

Although only a few exemplary embodiments of this invention have been described in detail above, those skilled in the art will readily appreciate that many modifications are possible in the exemplary embodiments without materially departing from the novel teachings and advantages of this invention. In various embodiments, the air gap is formed in a contact layer, a via layer, a first metal layer (or metal one), a second metal layer (metal two), and so on. In those embodiments, the two adjacent metal features 306 are contact features, metal lines, or vias. In another embodiment, the air gap may be formed in both a metal layer between two adjacent metal lines and a via layer between two adjacent vias through in dual damascene technique by implementing the method 400. In another embodiment, the etch process at step 410 to create the gap 320 includes two etch steps having a dry etch step and a wet etch step. The dry etch step is first applied to the liner layer to form the spacer of the liner layer. The dry etch step may proceed to partially etch the ILD layer 304 within the opening between the liner spacers, forming the gap in the ILD layer 304. The wet etch step is subsequently applied to the ILD layer 304 to further expand the gap vertically and laterally.

It is understood that various different combinations of the above-listed embodiments and steps can be used in various sequences or in parallel, and there is no particular step that is critical or required. Furthermore, features illustrated and discussed above with respect to some embodiments can be combined with features illustrated and discussed above with respect to other embodiments. Accordingly, all such modifications are intended to be included within the scope of this invention.

What is claimed is:

1. An integrated circuit ("IC") structure comprising:
    a substrate having two adjacent interconnect features formed thereon;
    caps formed over and aligned with each of the interconnect features;
    sidewalls formed on opposing sides of each of the interconnect features and a gap formed between the interconnect features;
    a liner spacer layer formed over one of the caps; and
    a dielectric layer disposed over the substrate to cover the gap and the liner spacer layer that is over the one of the caps.

2. The IC of claim 1, wherein the liner spacer layer formed over one of the caps overlies one of the sidewalls and laterally contacts the one of the caps.

3. The IC of claim 1 wherein the caps comprise one of tantalum ("Ta"), tantalum nitride ("TaN"), cobalt tungsten phosphide ("CoWP") and ruthenium ("Ru").

4. The IC of claim 1 wherein the sidewalls comprise silicon oxide.

5. The IC of claim 1 wherein each of the interconnects comprises copper.

6. The IC of claim 1 further comprising an etch stop layer ("ESL") disposed over the substrate to cover the caps and the gap.

7. An integrated circuit ("IC") structure comprising:
two metal interconnects formed on a semiconductor substrate;
caps formed on and directly overlying each of the metal interconnects;
sidewalls formed on opposing sides of each of the metal interconnects and a gap disposed between the metal interconnects;
a liner spacer overlying one of the sidewalls and laterally contacting one of the caps, wherein the one of the caps directly overlies the liner spacer laterally contacting the one of the caps; and
a dielectric layer disposed over the semiconductor substrate to cover the cap and the gap.

8. The IC of claim 7 wherein the caps comprise one of tantalum ("Ta"), tantalum nitride ("TaN"), cobalt tungsten phosphide ("CoWP") and ruthenium ("Ru").

9. The IC of claim 7 wherein the liner spacer comprises at least one of SiOC, SiN, and SiON.

10. The IC of claim 7 wherein the sidewalls include silicon oxide and the interconnects include Cu.

11. The IC of claim 7 further comprising an etch stop layer ("ESL") disposed over the semiconductor substrate to cover the cap and the gap.

12. The IC of claim 7 wherein the dielectric layer comprises a low-k dielectric material.

13. The IC of claim 7 wherein the thickness of the sidewalls is related to a size of the caps, a thickness of the liner spacer, and a length of time etching is performed to create the gap.

14. The IC of claim 7 wherein the liner spacer extends to directly over the sidewalls.

15. An integrated circuit ("IC") structure comprising:
a substrate having a first interconnect feature adjacent a second interconnect feature, the first interconnect feature having a first sidewall and the second interconnect feature having a second sidewall opposing the first sidewall;
a gap formed between the first and second sidewalls;
a first cap formed over the first interconnect feature;
a liner spacer layer formed over the substrate and having a first portion over the first cap and second portion under a portion of the first cap; and
a dielectric layer disposed over the substrate to cover the liner spacer layer, the first cap, and the gap.

16. The IC of claim 15, wherein the second portion of the liner spacer layer physically contacts the first sidewall.

17. The IC of claim 15, wherein the second portion has an edge that is vertically aligned with an outer edge of the first sidewall, the outer edge of the first sidewall facing the gap.

18. The IC of claim 15, wherein the first portion has an outer edge that is vertically aligned with an outer edge of the second potion.

19. The IC of claim 1, wherein one of the caps has a non-uniform thickness.

20. The IC of claim 1, wherein one of the caps has a first height at a central portion of the cap and a second height at an outer perimeter of the cap, the first height being greater than the second height.

* * * * *